United States Patent [19]

LeCroy, Jr.

[11] 4,423,373
[45] Dec. 27, 1983

[54] TEST PROBE

[75] Inventor: Walter O. LeCroy, Jr., Piermont, N.Y.

[73] Assignee: LeCroy Research Systems Corporation, Spring Valley, N.Y.

[21] Appl. No.: 243,993

[22] Filed: Mar. 16, 1981

[51] Int. Cl.³ ............................................. G01R 31/02
[52] U.S. Cl. .................. 324/72.5; 324/158 P; 324/73 PC
[58] Field of Search ............... 324/73 PC, 158 P, 149, 324/72.5, 444, 445, 446

[56] References Cited

U.S. PATENT DOCUMENTS

| | | | |
|---|---|---|---|
| 1,670,640 | 5/1928 | Smith | 324/446 |
| 3,315,163 | 4/1967 | Lutz | 324/149 |
| 4,115,731 | 9/1978 | Axtell | 324/72.5 |
| 4,245,189 | 1/1981 | Wahl et al. | 324/158 P |

*Primary Examiner*—Michael J. Tokar
*Assistant Examiner*—Kevin D. O'Shea

*Attorney, Agent, or Firm*—Curtis, Morris & Safford

[57] ABSTRACT

A test probe having only two substantially rigid electrically conducting members which are insulated from each other, these members terminating in respective contact portions. When the probe is in use, these two contact portions simultaneously contact spaced apart areas of a current conducting segment then being tested. An insulated handle is formed by a protecting layer of insulation coupled to the two conducting members; and a pair of conducting leads pass through the handle and are electrically connected to the respective conducting members. In a preferred embodiment, the two conducting members are constituted by a cylindrical shaft which is longitudinally bisected into separate longitudinal portions that are bonded to each other by a layer of insulating adhesive. The cylindrical shaft terminates in a conical contact tip which also is longitudinally bisected, the two bisected portions of this tip constituting the contact portions of the probe.

4 Claims, 8 Drawing Figures

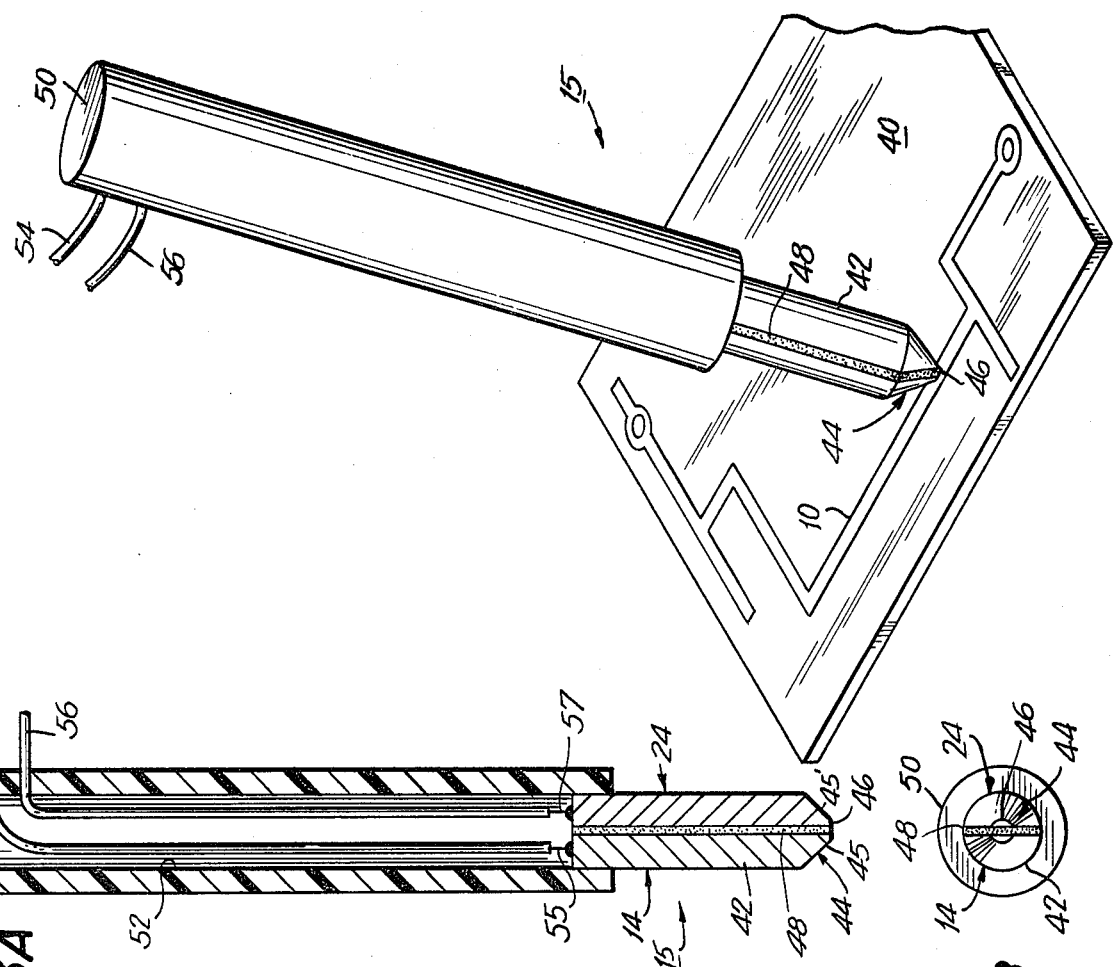
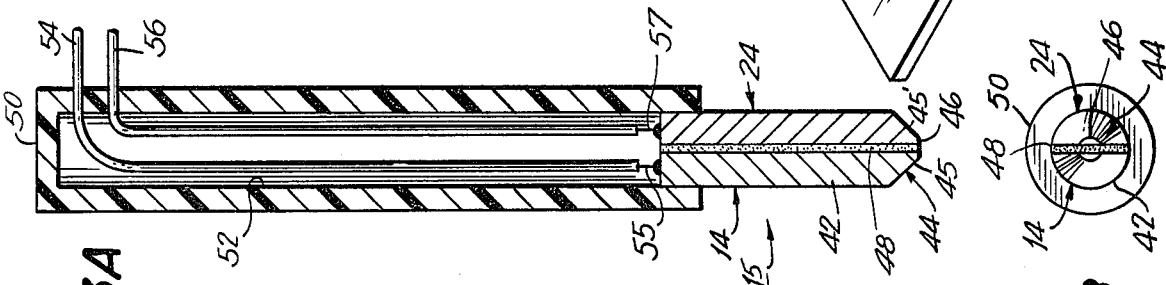
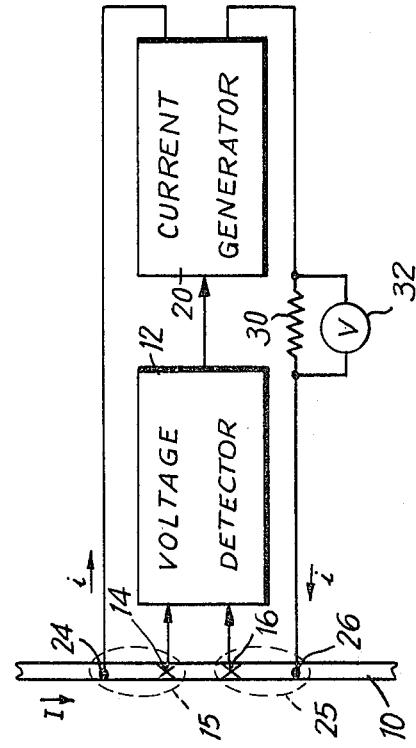

TEST PROBE

BACKGROUND OF THE INVENTION

This invention relates to a test probe and, more particularly, to such a test probe which is readily adapted for use in a current measuring device of the type which measures current flowing in a conducting segment, which probe merely need be brought into electrical contact with that segment.

In one type of current measuring apparatus, current flowing through a conducting segment, such as a segment provided on a printed circuit board, is measured without requiring any physical alteration, splicing or other intrusion into that segment. Current measurements are attained merely by contacting that segment with two pairs of spaced apart conductors. In each pair of conductors, one conductor is adapted to supply voltage to a voltage detector, and the other conductor is adapted to supply current to the segment. It is important that the voltage and current conductors of a respective pair contact the segment in close poximity to each other.

In using such current measuring apparatus, the voltage and current conductors are brought into contacting relationship with the conducting segment by an operator. It is most difficult, if not impossible, for an operator to use four separate, independently manipulatable conductors. Consequently, it is desirable to combine the current and voltage conductors of one pair into a single hand-held probe, and to combine the current and voltage conductors in the other pair into another, single hand-held probe. Desirably, such a probe should be of relatively simple construction, easy to manipulate and insure good contact between the conducting segment then being tested and each of the current and voltage conductors included in that probe. Furthermore, since such a probe should be used by technicians who need not exhibit an inordinate amount of skill, such probes should be designed so that, when used, good contacting relationship can be obtained over a wide range of tolerances, such as the particular angle and orientation of the probe as it is brought into contact with the conducting segment.

One type of probe is described in U.S. Pat. Nos. 4,178,543, 4,178,544 and 4,179,652, wherein a test probe is provided with three separate conductors, all of which are brought into contact with a conducting segment then being tested. This probe, however, is of relatively complex construction, is rather bulky and thus difficult to use, and requires that the probe be brought into contacting relationship with the conducting segment in a predetermined orientation. Furthermore, the particular positions of the three conductors limits the versatility of that probe to what appears to be relatively limited utility.

OBJECTS OF THE INVENTION

Therefore, it is an object of the present invention to provide an improved test probe which satisfies the foregoing desirable features and characteristics, yet avoids the defects and disadvantages of prior art probes.

Another object of this invention is to provide a test probe which is of relatively simple construction and is easy to use.

A further object of this invention is to provide a test probe formed of only two conductors which are coupled to a single handle, which conductors are adapted to be brought into simultaneous contact with a current conducting segment then being tested.

Yet another object of this invention is to provide an improved test probe which can be brought into contact with a conducting segment over a wide range of angles and orientations, thus permitting the use of that probe in different printed circuits and at different locations in such circuits.

It is an additional object of this invention to provide an improved test probe having wide versatility for use under various conditions.

Various other objects, advantages and features of the present invention will become readily apparent from the ensuing detailed description, and the novel features will be particularly pointed out in the appended claims.

SUMMARY OF THE INVENTION

In accordance with the present invention, a test probe is provided with only two substantially rigid electrically conducting members that are electrically insulated from each other and which terminate in respective contact portions that are adapted to simultaneously contact spaced apart areas of a current conducting segment then being tested. A pair of conducting leads pass through an insulated handle to which the conducting members are coupled, and are brought into electrical connection with such members. In accordance with a preferred embodiment, the conducting members are constituted by a cylindrical shaft which is longitudinally bisected into separate longitudinal portions, these longitudinal portions being separated from each other by an insulating adhesive. The cylindrical shaft terminates in a conically shaped contact tip which also is bisected into separate portions.

BRIEF DESCRIPTION OF THE DRAWINGS

The following detailed description, given by way of example, will best be understood in conjunction with the accompanying drawings in which:

FIG. 1 is partial block, partial schematic diagram of current measuring apparatus with which the present invention finds ready application;

FIG. 2 is a perspective view of the use of a preferred embodiment of the test probe of this invention;

FIGS. 3A and 3B are sectional and bottom views, respectively, of a preferred embodiment of the test probe;

DETAILED DESCRIPTION OF CERTAIN PREFERRED EMBODIMENTS

Figure 6:
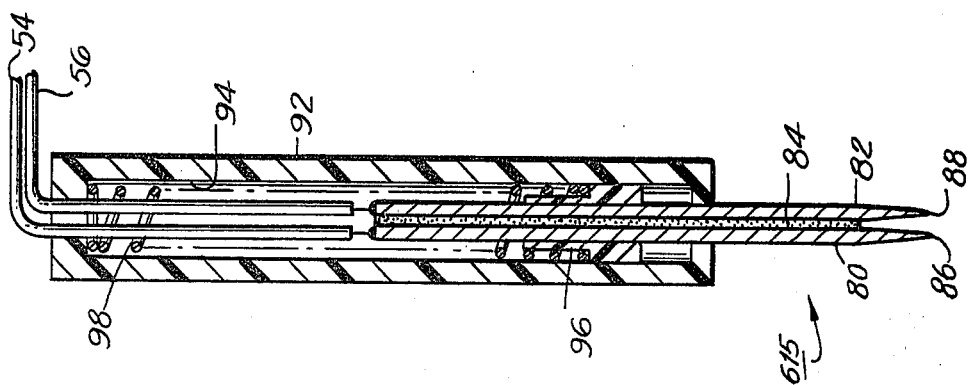
FIG. 6 is a sectional view of a still further embodiment of the test probe.

Before describing a preferred embodiment of the test probe of the present invention, reference is made to FIG. 1 which is a partial block, partial schematic diagram of current measuring apparatus with which the probe of this invention is readily used. This current measuring apparatus is adapted to measure an unknown electrical current I flowing through a current conducting segment 10, such as a portion of an electrical lead which, typically, may be a lead provided on a printed circuit board. For the purpose of the present description, it will be assumed that this unknown current I is a DC current. The current measuring apparatus illustrated in FIG. 1 is comprised of a voltage detector 12, a current generator 20 and a voltmeter 32. The voltage detector is adapted to detect voltages of very low magnitudes, for example, on the order of microvolts. This voltage detector is provided with a pair of inputs which are coupled to spaced apart contact points on segment 10 via conducting members 14 and 16, respectively.

Current generator 20 is adapted to produce a DC current i, and to supply this DC current to segment 10. The current generator is provided with a pair of outputs which are coupled to the segment by way of another pair of conducting members 24 and 26, respectively. Conducting members 24 and 26 contact segment 10 at locations which are spaced far enough apart to encompass the contact locations of conducting members 14 and 16. Thus, the DC current i produced by current generator 20 flows from conducting member 26 to conducting member 24 and passes through that portion of segment 10 which is defined by conducting members 14 and 16.

The illustrated arrangement in which current is carried by one set of conducting members 24,26 and voltage is sensed by another pair of conducting members 14,16 has the effect of eliminating from the operation of the illustrated circuit the effects of contact resistance between the conducting members and the conducting segment. The voltage drops produced at the interface between the current-carrying conducting members 24,26 and conducting segment 10 because of contact resistance are of no consequence inasmuch as they occur outside the contact locations of voltage-measuring conducting members 14,16. Hence, such voltage drops are not measured. Furthermore, voltage detector 12 exhibits a relatively high impedance and, therefore, conducting members 14 and 16, together with the leads which couple these conducting members to the inputs of voltage detector 12, carry no current and, thus, there is virtually no voltage drop at these conducting members.

Current generator 20 also includes a control input terminal coupled to the output of voltage detector 12. Depending upon the voltage supplied to this control input of the current generator, the magnitude of the DC current i produced thereby varies accordingly. For example, if the voltage supplied to the current generator by voltage detector 12 admits of a relatively large value, the variation in the current supplied to segment 10 by current generator 20 is correspondingly large. As the voltage detected by voltage detector 12, and supplied to current generator 20 is reduced, the variation of the current supplied to segment 10 by the current generator likewise is reduced. Thus, if a zero or null voltage is detected by voltage detector 12, a substantially zero voltage is supplied to the current generator, resulting in substantially no variation, or change, in current i. That is, when voltage detector 12 detects a null voltage, the current then supplied to segment 10 by current generator 20 remains at its then-existing value.

The output of current generator 20 is supplied via a measuring, or calibrating resistor 30 to conducting segment 10. Voltmeter 32 is connected across resistor 30 to provide a measurement, or indication, of the voltage due to the current i flowing through this resistor. For example, voltmeter 32 may comprise a digital voltmeter, and resistor 30 may be particularly calibrated such that the voltage displayed on this voltmeter represents the amount of current i flowing through the resistor. That is, if voltmeter 32 is calibrated in terms of current, a direct reading of current i is obtained.

In operation, when conducting members 14, 16, 24 and 26 initially are brought into contact with segment 10, the voltage across conducting segments 14,16, attributed to the flow of unknown current I through the segment, is equal to the product of this current and the low resistance of that portion of the segment which is defined between conducting members 14 and 16. This voltage is detected as a maximum voltage and, hence, current i is supplied from current generator 20, through resistor 30 to segment 10 via conducting member 26. This current i flows in the opposite direction to unknown current I, and is returned to the current generator via conducting member 24. Since the voltage detected by voltage detector 12 is a maximum, current i increases in magnitude. It is seen that the voltage due to unknown current I, and detected by voltage detector 12, is reduced by the voltage due to the flow of current i in segment 10 in the opposite direction. As this detected voltage is reduced, the control voltage supplied to current generator 20 likewise is reduced. Hence, current i, although continuing to increase, does so at a much slower rate. As the magnitude of current i approaches the magnitude of the unknown current I, the voltage across conducting members 14,16 is further reduced. This reduced voltage, as detected by voltage detector 12, results in a still slower change in current i. Of course, as current i increases, voltmeter 32 provides a reading, or measurement, of the magnitude of this current. Ultimately, current i is equal to, and thus substantially cancels, the unknown current I flowing in segment 10 through conducting members 24 and 26. This results in a null voltage detected by voltage detector 12, which null voltage produces no change in current i. Hence, current i now is equal to the magnitude of unknown current I, and voltmeter 32 provides a reading, or measurement, of this unknown current.

In accordance with the present invention, conducting members 14 and 24 are combined in a single probe 15; and, likewise, conducting members 16 and 26 are combined in a single probe 25. Each probe is hand-held by an operator and, when probe 15, for example, is brought into contact with conducting segment 10, conducting members 14 and 24 are brought into proper electrically conductive relationship with the segment. One embodiment of a test probe in accordance with the present invention is illustrated by the sectional view of FIG. 3A and the bottom view of FIG. 3B, and is shown in typical use in FIG. 2. As shown in FIG. 2, probe 15 is adapted to be brought into contact with segment 10 of a typical printed circuit board 40. Of course, another probe 25, similar to probe 15, also should be brought into contact with segment 10, as discussed above with respect to FIG. 1. However, in the interest of simplification, FIG. 2 illustrates the use of only a single probe 15.

Probe 15 is comprised of a cylindrical shaft 42, formed of electrically conductive material, such as aluminum, steel, or the like. This cylindrical shaft preferably is a solid shaft, but may be hollow, and, as shown in FIG. 3A, terminates in a conically shaped contact tip 44. Furthermore, cylindrical shaft 42 is longitudinally bisected into separate longitudinal portions 14 and 24, respectively. That is, conducting members 14 and 24 constitute the separate longitudinal portions into which cylindrical shaft 42 is bisected. It is appreciated that such bisecting of the shaft occurs in a plane which contains the longitudinal axis thereof. Conically shaped contact tip 44 likewise is bisected into separate contact portions 45 and 45', respectively. It is, of course, appreciated that contact tip 44 and cylindrical shaft 42 are of integral construction and, therefore, contact portion 45 and conducting member 14 are of integral construction and, similarly, contact portion 45' and conducting member 24 likewise are of integral construction.

The separate longitudinal portions of shaft 42 and tip 44 are electrically insulated from each other by a layer of insulating material 48 that is interposed between the separate longitudinal portions. As shown in FIGS. 3A and 3B, insulating material 48 may be sufficiently thin so as to be considered to be a plane which contains the longitudinal axis of shaft 42. Preferably, insulating material 48 is an insulating adhesive which bonds conducting members 14 and 24 in face-to-face relationship. Likewise, contact portions 45 and 45' of conically shaped contact tip 44 are bonded in face-to-face relationship by such an insulating adhesive.

Since material 48 is an insulating material, it is appreciated that conducting members 14 and 24, as well as contact portions 45 and 45' thereof, are electrically insulated, or isolated, from each other. As used herein, the term electrical isolation means that a conducting path is not present between conducting members 14 and 24. Although relatively minor leakage may occur across insulating material 48, nevertheless, the conducting members are assumed herein to be electrically isolated from each other.

For clarity in illustration, tip 44 is shown as being terminated in a contact area 46 that is drawn relatively larger than its actual implementation; and insulating layer 48 is drawn relatively thicker than its actual implementation. For optimum operation and performance of this probe, insulating layer 48 should be as thin as practicable so that contact portions 45 and 45' are extremely close together; and so that contact area 46 likewise is very small. These features help assure that both contact areas 45 and 45' contact segment 10 independently of the angle at which the probe contacts the segment and of the amount of pressure exerted on the probe by the operator.

Cylindrical shaft 42 is secured to a handle 50, the latter being of insulating material and being adapted to be hand-held by an operator. Shaft 42 may be adhesively secured to handle 50 or, if desired, suitable matching screw threads may be provided on the upper portion of shaft 42 and on the interior wall of recess 52 of handle 50. Conducting leads 54 and 56 are electrically connected to conducting members 14 and 24, respectively, such as by solder connections 55 and 57. Leads 54 and 56 pass through suitable apertures, or a single aperture, of handle 50 and, thus, may be coupled to voltage detector 12 and current generator 20 in the manner schematically illustrated in FIG. 1.

Although handle 50 is illustrated as containing recess 52, it is appreciated that, if desired, the handle may be of solid, integral construction suitably coupled to shaft 42.

As seen in FIG. 2, handle 50 enables an operator of probe 15 to hold this probe in only one hand, while bringing the probe towards segment 10 of printed circuit board 40 such that contact portions 45 and 45' simultaneously contact the conducting segment. Since the layer of insulating material 48 is extremely thin, probe 15 may be used without requiring the operator to manipulate or hold this probe in a special configuration. Preferably, however, the probe is used such that layer 48 is not parallel to the direction of current flow in segment 10. However, any other angular configuration of the probe relative to conducting segment 10 may be adopted. It is not necessary that the longitudinal axis of shaft 42 be disposed only perpendicular to conducting segment 10. Because of the small size of contact area 46, and the thinness of insulating layer 48, virtually any configuration between the longitudinal axis of shaft 42 and conducting segment 10 may be used successfully.

Since probe 15 resembles a "pencil" shape, it is expected that its configuration will be readily recognized by an operator. Moreover, two similar "pencil-shaped" probes can be used without difficulty by an operator to contact segment 10 at two separate locations, thereby facilitating the use of the apparatus shown in FIG. 1.

Figure 4A:
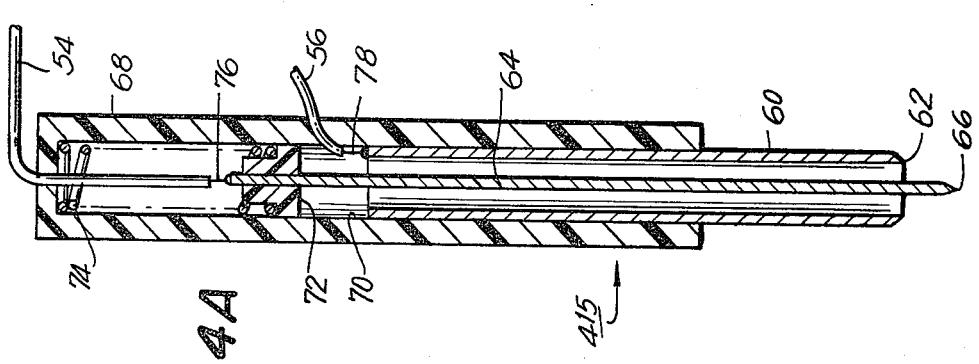
FIGS. 4A and 4B are sectional and bottom views, respectively, of another embodiment of the test probe.
Figure 4B:
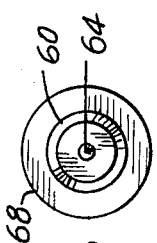

Another embodiment of the test probe in accordance with the present invention is illustrated as 415 in FIGS. 4A and 4B. In the embodiment described above, conducting members 14 and 24 are formed as a longitudinally bisected cylindrical shaft. In the embodiment shown in FIGS. 4A and 4B, these conducting members are shown as an electrically conductive, hollow cylindrical sleeve 60 which circumscribes a longitudinal rod 64, the latter being substantially concentric with the longitudinal axis of sleeve 60. Sleeve 60 terminates at its free end 62, and longitudinal rod 64 terminates at its free end 66, these free ends corresponding to the aforementioned contact portions of the probe. As before, a handle, shown as handle 68, is coupled to probe 415 at end portions of sleeve 60 and rod 64 which are remote from free ends 62 and 66, respectively.

Rod 64 is spring-biased so as to extend, or protrude, from sleeve 60 when probe 415 is not in use. When the probe is used, the free end, or tip 66 of rod 64 first is brought into contact with, for example, conducting segment 10. As force is exerted on probe 415, this force overcomes the spring-bias force, urging rod 64 to move along the longitudinal axis of sleeve 60, thereby withdrawing further into the sleeve. The spring-bias force exerted on rod 64 is produced by a spring 74 which, as illustrated in FIG. 4A, is disposed within a recess 70 of handle 68. Furthermore, a support block 72, having a peripheral edge which contacts the inner wall of recess 70, has rod 64 mounted therein, and is provided with a boss for receiving spring 74. It is appreciated that support block 72 provides proper orientation of rod 64 along the longitudinal axis of sleeve 60.

Conducting leads 54 and 56 are coupled to rod 64 and sleeve 60, respectively, via solder connections 76 and 78. Conducting leads 54 and 56 pass through handle 68 to be connected to the apparatus illustrated in FIG. 1.

Sleeve 60 and rod 64 may be formed of suitable electrically conductive material, such as aluminum, or the like.

By reason of the spring-bias force exerted on rod 66 by spring 74, it is appreciated that good electrical contact may be made between tip 66 and conducting segment 10. Furthermore, it is expected that the operator will press downwardly with a sufficient amount of force on probe 415 to provide good contact between free end 62 of sleeve 60 and the conducting segment. Spring 74 insures that, at the same time, rod 64 also is brought into good contact with the segment.

In a modification of the embodiment shown in FIG. 4A, support block 72, which is formed of an insulating material, is disposed within sleeve 60. Nevertheless rod 64 and sleeve 60 remain electrically isolated from each other. This modification is the electrical equivalent of the embodiment shown in FIG. 4A. With such a modification, recess 70 may be of reduced volume.

Figure 5:
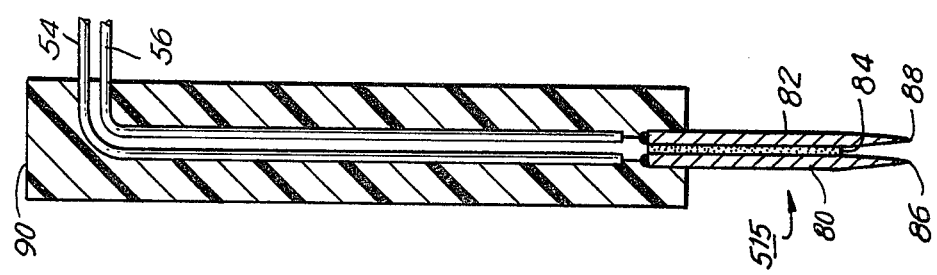
FIG. 5 is a sectional view of yet another embodiment of the test probe.

Yet another embodiment of the present invention is illustrated in FIG. 5. In this embodiment, probe 515 is comprised of a pair of needle-shaped electrodes 80 and 82, these electrodes being separated from each other by a layer of insulating material 84. For example, insulating material 84 may be an insulating adhesive to bond electrodes 80 and 82 to each other, yet maintain these electrodes in electrical isolation from each other. Electrodes 80 and 82 terminate in contact points 86 and 88. Thus, it is seen that needle-shaped electrodes 80 and 82 correspond to conducting members 14 and 24, described above.

Electrodes 80 and 82 are coupled to an insulating handle 90, such as by a suitable adhesive. Handle 90 may be solid, as illustrated, or may include a recess, such as the recesses described above. Conducting leads 54 and 56 are seen to be electrically connected, as by suitable solder connections, to electrodes 80 and 82.

In use, probe 515 is brought into contact with segment 10 such that contact points 86 and 88 exhibit good electrical contact with the segment. However, when using probe 515, its orientation with respect to conducting segment 10 must be maintained within careful tolerances to insure that contact points 86 and 88 remain in good contact with the segment. Furthermore, the particular angle between probe 515 and conducting segment 10 must be maintained relatively close to 90°. That is, the angle between conducting segment 10 and the generally longitudinal axis of probe 515 should be at or close to perpendicular to each other.

A modification of the embodiment shown in FIG. 5, resulting in enhancing the flexibility and use of the probe, is illustrated in FIG. 6 as probe 615. Probe 615 is similar to probe 515, except that electrodes 80 and 82 are mounted in a suitable support block 96, this support block being disposed within a recess 94 of handle 92 so as to permit longitudinal movement of the electrodes. A spring 98, similar to aforedescribed spring 74, exerts a spring bias force on support block 96, thereby urging, or biassing, electrodes 80 and 82 outwardly of handle 92. When probe 615 is brought into engagement with conducting segment 10, a downward force exerted by the operator on the probe opposes the spring bias force exerted on electrodes 80 and 82 by bias spring 98, thereby driving these electrodes interiorly of handle 92. It may be appreciated that, by reason of the spring bias force exerted on electrodes 80 and 82, relatively good electrical contact is made between contact points 86 and 88 and conducting segment 10. Hence, the orientation of probe 615 relative to conducting segment 10 need not be constrained to the more limited ranges associated with the use of probe 515.

While the present invention has been particularly shown and described with reference to preferred embodiments thereof, it will be readily apparent to those of ordinary skill in the art that various changes and modifications in form and details may be made without departing from the spirit and scope of the invention. It is intended, therefore, that the appended claims be interpreted as including such changes and modifications.

What is claimed is:

1. A test probe comprising only two substantially rigid electrically conducting members terminating in respective spaced apart contact portions, which contact portions, when said test probe is in use, simultaneously contact spaced apart areas of a current conducting segment, said two electrically conducting members being electrically insulated from each other and being formed of two fixed opposite, electrically isolated, longitudinal portions of a cylindrical shaft, said opposite longitudinal portions being in face-to-face relationship and separated from each other by a layer of insulating material sandwiched therebetween, and said contact portions being formed of a conically shaped tip of said cylindrical shaft having a contact surface for contacting said current conducting segment, said conically shaped tip being longitudinally separated by said sandwiched layer of insulating material into respective, opposite portions; and insulated handle coupled to said cylindrical shaft at an end portion thereof remote from said conically shaped tip for enabling an operator of said test probe to hold said probe in one hand with both portions of said conically shaped tip in contact with said current conducting segment; and first and second conducting leads electrically connected to respective ones of said opposite portions of said cylindrical shaft to selectively supply signals to and receive signals from said opposite portions of said cylindrical shaft.

2. The probe of claim 1 wherein the respective opposite portions of said conically shaped tip are integrally constructed with the respective opposite longitudinal portions of said cylindrical shaft.

3. The probe of claim 2 wherein the layer of insulating material separating said longitudinal portions of said cylindrical shaft and said portions of said conically shaped tip comprises an insulating adhesive for joining said respective portions, said insulating adhesive terminating in said contact surface.

4. The probe of claim 3 wherein said longitudinal portions of said cylindrical shaft are substantially equal half portions, and said portions of said conically shaped tip also are substantially equal half portions.

* * * * *